United States Patent [19]

Tompsett

[11] Patent Number: 4,580,103

[45] Date of Patent: Apr. 1, 1986

[54] AMPLIFIER CIRCUIT ARRANGEMENT FOR ELIMINATING INPUT SIGNAL OFFSET IN THE OUTPUT

[75] Inventor: Michael F. Tompsett, Summit, N.J.

[73] Assignee: AT&T Bell Laboratories, Murray Hill, N.J.

[21] Appl. No.: 623,575

[22] Filed: Jun. 22, 1984

[51] Int. Cl.$^4$ ............................................. H03F 1/26
[52] U.S. Cl. ........................................ 330/9; 330/51; 330/107
[58] Field of Search ...................... 330/9, 11, 51, 107, 330/109, 149; 333/173; 307/520

[56] References Cited

PUBLICATIONS

Gregorian et al., "MOS Sampled-Data High-Pass Filters Using Switched-Capacitor Integrators", *Microelectronics Journal*, vol. 11, No. 2, Mar.-Apr. 1980, pp. 22–25.

*Primary Examiner*—James B. Mullins
*Attorney, Agent, or Firm*—David I. Caplan

[57] ABSTRACT

In a semiconductor integrated circuit comprising an amplifier for detecting the presence of a carrier on an incoming wave signal, in order to suppress dc offset in the incoming wave and at the same time minimize any inherent input amplifier offset, the amplifier is supplied with a switched capacitor input network connected between a first input terminal of the amplifier and a circuit input terminal for receiving an incoming signal, and with a switched capacitor feedback network connected between an output terminal of the amplifier and a second (opposite polarity) input terminal of the amplifier.

13 Claims, 1 Drawing Figure

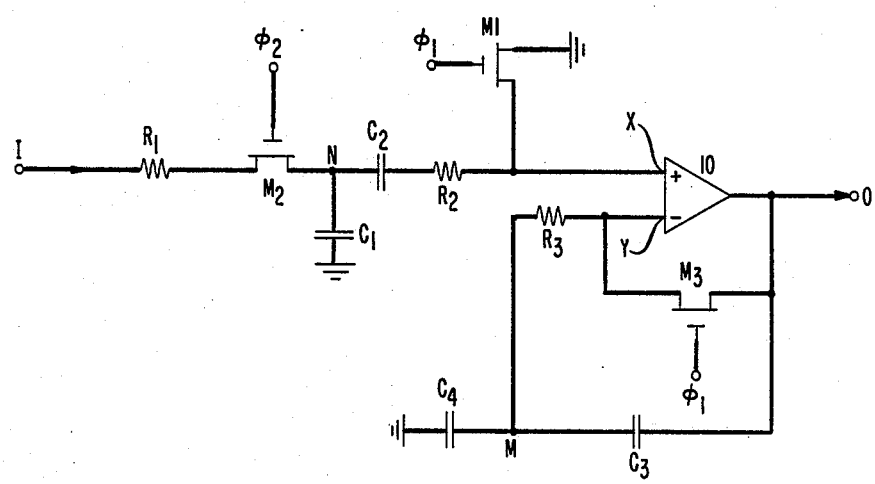

AMPLIFIER CIRCUIT ARRANGEMENT FOR ELIMINATING INPUT SIGNAL OFFSET IN THE OUTPUT

FIELD OF THE INVENTION

This invention relates to semiconductor integrated circuit arrangements and more particularly to those in which dc offset voltages in the input signal to an amplifier are eliminated from the amplifier output and at the same time any inherent dc input offset in the amplifier is not amplified by the amplifier.

BACKGROUND OF THE INVENTION

In a variety of contexts, it is desired to amplify an ac input signal by means of an operational amplifier, whereby any offset (dc component) in the input is removed by the amplifier while only the ac components in the input are amplified. For example, in a circuit for detecting the presence versus absence of an ac carrier signal wave of amplitude greater than a given threshold level in an incoming input wave signal, the incoming signal is fed serially through an operationl amplifier, a (full-wave) rectifier, and a low pass (smoothing) filter to a threshold detector. Typically, the threshold detector is a Schmitt trigger detector which can be trimmed by an auxiliary threshold trimmer circuit in order to adjust the threshold of signal to be detected. When the carrier wave is present in the incoming signal, the output of the amplifier contains an ac component which is an amplified voltage representative of the carrier. In response thereto, the rectifier delivers a rectified amplified voltage representative of the amplitude of the carrier to the low pass filter which in turn delivers an above-threshold dc voltage to the threshold detector. Thus, when the carrier wave is present in the incoming wave with an amplitude that is above the detector threshold, the presence of the carrier is detected as is desired. At the same time, however, the incoming signal can contain an unpredictable amount of signal offset (dc component), and any such offset in the incoming signal will also cause delivery to the threshold detector of an above-threshold dc voltage of unpredictable amount, whereby the detector falsely detects the presence of a (nonexistent) carrier in the incoming signal, because there is undesirably no essential difference in the voltage that is delivered to the detector in the case where the incoming signal contains dc offset without carrier and the case where the incoming signal contains carrier (with or without dc offset). This problem is excerbated in a typical situation where the incoming carrier wave amplitude is only about 7 to 10 millivolts while the offset in the incoming wave can attain a value as high as 100 millivolts of either polarity and saturate the amplifier, whereby amplification of the carrier is undesirably reduced to zero.

Another problem that occurs in amplifying the carrier arises from the inherent dc offset of the amplifier, typically about 5 millivolts of either polarity. Such amplifier offset typically is a steady but not precisely predictable value and could be compensated for by trimming the threshold detector, but this offset is also undesirably amplified, with gain substantially above unity, by the amplifier. Hence, this offset could not easily be compensated by trimming the threshold, because an ordinary trimmer circuit cannot handle such a large offset, i.e., an offset which is thus about as large as the amplitude of the rectified carrier.

It would therefore be desirable to have an amplifier circuit arrangement for amplifying an input ac signal whereby any offset that is present in the input ac signal is eliminated, and whereby the inherent dc input offset in the amplitude is not amplified with gain substantially above unity.

SUMMARY OF THE INVENTION

In an integrated circuit comprising an amplifier for detecting the presence of an ac carrier on an incoming wave signal, in order to suppress dc offset in the incoming wave and at the same time minimize any inherent input amplifier offset, the amplifier is supplied with a switched capacitor input network connected between a first input terminal of the amplifier and a circuit input terminal for receiving an incoming signal, and with a switched capacitor feedback network connected between an output terminal of the amplifier and a second (opposite polarity) input terminal of the amplifier.

In a specific embodiment, the switched capacitor input network comprises:

(1) a first clocked transistor connected between a reference terminal (ground) and the first input terminal of the amplifier;

(2) a second, complementary clocked transistor connected between the circuit input terminal and an internal node;

(3) a first capacitor connected between the internal node and the reference terminal; and (4) a second capacitor connected between the internal node and the first input terminal of the amplifier, whereby during operation the voltage developed at the amplifier output terminal is substantially free of any dc offset in the incoming ac signal when applied to the circuit input terminal; and (5) the switched capacitor feedback network comprises:

(a) a third clocked transistor, clocked in the same way as the first transistor, connected between the amplifier output terminal and the second input terminal of the amplifier;

(b) a third capacitor connected between the amplifier output terminal and a second internal node which is ohmically coupled to the second input terminal of the amplifier; and (c) and fourth capacitor connected between the second internal node and the reference terminal, whereby the operating gain of the amplifier is approximately equal to the ratio of the capacitance of the fourth to the third capacitor, and whereby the inherent input offset of the amplifier appears on the output terminal without substantial gain (i.e., with unity gain or less). In this way, for example, an ac carrier which is present in an input can be amplified with controlled (linear) gain, and at the same time any dc offset in the input can be reduced to an arbitrary small value in the output, while any dc offset in the amplifier is not amplified with gain greater than unity.

BRIEF DESCRIPTION OF THE DRAWING

This invention together with its features, advantages, and characteristics may be better understood from the following detailed description when read in conjunction with the drawing in which the FIGURE is an electrical schematic of a circuit portion for detecting the presence of an incoming carrier wave in accordance with a specific embodiment of the invention. It should be understood that the circuit portion is integrated in a p-type semiconductor substrate which is maintained at a steady dc voltage bias $V_{SS}$ typically equal to $-5.0$ volts in combination with n-channel MOS transistors (NMOS technology). Alternatively, CMOS technology can be used with n-channel and p-channel transistors connected in parallel, as known in the art, in combination with an n-tub voltage bias $V_{DD}$ typically equal to about $+5.0$ volts; ground is 0.0 volt.

DETAILED DESCRIPTION

The FIGURE shows a circuit portion 100 comprising an operational amplifier 10, having positive and negative input terminals X and Y, respectively, for amplifying a carrier signal presented at a circuit input terminal I and at the same time suppressing any dc offset in the incoming signal. The circuit portion 100 has an output terminal O to which the amplifier delivers an output signal representative of the thus amplified carrier. It should be understood, however, that this output signal is in the form of a sampled signal, as produced by clocked switches as more fully described below.

Basically, the amplifier 10 is supplied with a switched capacitor input network comprising capacitors $C_1$ and $C_2$, resistors $R_1$ and $R_2$, and clocked transistors $M_1$ and $M_2$, as well as a switched capacitor feedback network comprising capacitors $C_3$ and $C_4$, resistor $R_3$, and a clocked transistor $M_3$. In the input network, the clocked transistor $M_2$ and resistor $R_1$ are connected in series between the input terminal I and an internal network node N; the capacitor $C_1$ is connected between the node N and ground; the capacitor $C_2$ and resistor $R_2$ are connected in series between the node N and the positive input terminal X of the amplifier 10; and the clocked transistor $M_1$ is connected between the input terminal X and ground. By "ground" is meant the voltage reference of the semiconductor substrate (not shown) in which the circuit portion 100 is integrated, or any other convenient reference. In the switched capacitor output network, the clocked transistor $M_3$ is connected between the output terminal O and the negative input terminal Y of the amplifier 10; the capacitors $C_3$ and $C_4$ are connected between the output terminal O and ground; and a node M located between the capacitors $C_3$ and $C_4$ is connected through the resistor $R_3$ to the negative input terminal Y. The clocking of $M_1$ and $M_3$ supplied by $\phi_1$ is complementary to that of $M_2$ supplied by $\phi_2$; that is, when $M_2$ is on, $M_1$ and $M_3$ are off; and when $M_2$ is off, $M_1$ and $M_3$ are on.

The purpose of the resistors $R_2$ and $R_3$ is to minimize settling of the amplifier following the transitions of the clocked transistors, and these resistors will not be discussed furthr except to mention that advantageously they are substantially equal, typically to about 5,000 ohms. By thus making $R_2=R_3$, equal parasitic signals picked up by resistors $R_2$ and $R_3$, such as noise in the power supply, cancel each othr out, especially if these resistors are integrated in close mutual proximity on the same semiconductor substrate. $C_1$ and $R_1$ together form a low pass filter. Typically, $R_1$ is approximately equal to $3 \times 10^5$ ohms. The capacitors $C_1$ and $C_2$ are conveniently substantially equal:

$$C_1 = C_2 = C \tag{1}$$

Typically $C_1$ and $C_2$ are equal to about 20 pF ($C_1$ includes about 4 pF parasitic capacitance). Advantageously, $1/C_4 = 1/C_1 + 1/C_2$, so as to match the capacitances seen by nodes X and Y of the amplifier and thus to minimize switch offset error. Thus, for $C_1 = C_2 = 20$ pF, $C_4 = 10$ pF. The capacitor $C_3$, typically about 0.15 pF, is selected to provide a suitable amplification of the carrier, as described more fully below.

The amplifier 10 has an open loop gain g. That is, when the feedback network is removed and the negative input terminal is connected to an external voltage, then the output voltage $V_o$ of the amplifier is given by $V_o = g(X-Y)$, where X and Y are the instantaneous voltages at the input terminals X and Y. Typically, this open loop g is of the order of $10^3$ to $10^4$ and is too high for amplifying ordinary signals in a linear fashion. This gain, moreover, would also be imposed upon any dc offset voltage $v_s$ of the amplifier, whereby the output $V_o$ would undesirably contain an unduly large dc offset component $gv_s$. The feedback network reduces the gain of the carrier frequency to the controllable value of $C_4/C_3$ so that the gain of the amplifier is linear, this approximation being valid provided that $C_4/C_3$ is much less than g. At the same time, the gain of the offset $v_s$ is then approximately equal to unity rather than g. Typically, $C_4/C_3$ is of the order of one hundred, and at any rate is advantageously less than g by a factor of ten or more, whereby during operation the amplifier 10 is maintained in its linear range of amplification.

Briefly, the operation of the circuit portion 100 is as follows. The clocks $\phi_1$ and $\phi_2$ are advantageously nonoverlapping, whereby $M_1$ and $M_3$ periodically are switched on and off while $M_2$ is switched off and on, respectively. The periodicity t of these clocks is made the same, and is made of such a value that the corresponding clock frequency $f = 1/t$ is at least five or ten times that of the frequency F of the carrier at the input terminal I to be amplified. Analysis of the resulting switched input network—for the case of large f/F (i.e., greater than about ten), small inherent amplifier input capacitance relative to the sum of $C_1$ and $C_2$ ($C_1+C_2$), and $C_1 = C_2$ in accordance with equation 1—shows that the amplitude of the (switched) ac signal $V_X$ developed at the input terminal X when $M_2$ is on is approximately given by:

$$V_X = 4\pi F V_I / f \tag{2}$$

where $V_I$ is the amplitude of the carrier wave. At the same time, as shown below, there is virtually no dc component at the amplifier input terminal X despite the presence of such dc component at the circuit input terminal I.

On the other hand, the analysis presented below of the resulting switched output network shows that the amplitude of the signal $V_o$ at the output terminal O is given approximately by:

$$V_o = V_x(1 + C_4/C_3) + v_s \tag{3}$$

where it is assumed that, when the feedback network is disconnected, the resulting open loop gain is large compared with $C_4/C_3$. Note that because $V_x$ is free of any signal induced dc (offset) component, $V_o$ is also free of any dc offset corresponding to input signal offset. Thus, from equations 2 and 3 above, in terms of the input carrier amplitude the output will be equal to:

$$V_o = (4\pi F V_I / f)(1 + C_4/C_3) + v_s. \tag{4}$$

Accordingly, the output $V_o$ will be free of all offsets except for an unamplified (unity gain) offset of the amplifier itself. On the other hand, $C_4/C_3$ is ordinarily selected to be much greater than unity, so that the output component at the frequency of the incoming carrier wave has an amplitude $V_o$ that is approximately equal to:

$$V_o = (4\pi F/f)(C_4/C_3)V_I + v_s. \tag{5}$$

Accordingly, for a typical case of $F/f = 1/20 = 0.05$ and $C_4/C_3 = 130$:

$$V_o = 85V_I + v_s, \text{ approximately.} \tag{6}$$

Operation of the Switched Capacitor Input Network

For convenience, $C_1 = C_2 = C$ and initially assume the input at terminal I is a constant K. Thus, when the clocked transistor $M_2$ is off, $M_1$ is on, and thus the voltages across $C_1$ and $C_2$ will be the same, say $V_1$, equal to some fraction, say $\epsilon$, of the instantaneous value of the input K, so that $V_1 = \epsilon K$.

Accordingly, there will be charges $Q_1$ and $Q_2$ on $C_1$ and $C_2$, respectively, given by $Q_1 = C_1 \epsilon K$, $Q_2 = C_2 \epsilon K$. Since for convenience $C_1 = C_2 = C$, it follows that:

$$Q_1 = Q_2 = C\epsilon K \tag{7}$$

and $Q_1$ and $Q_2$ will therefore be denoted simply by Q (without subscript). Then, when $M_1$ turns off and $M_2$ turns on, charges $q_1$ and $q_2$ flow into $C_1$ and $C_2$, respectively, such that:

$$C_1 K = Q + q_1 = \epsilon C_1 K + q_1 \tag{8}$$

$$C_2(K - X_1) = Q + q_2 = \epsilon C_2 K + q_2 \tag{9}$$

where $X_1$ is the voltage at terminal X. However, since the input capacitance of this amplifier input terminal X is ordinarily so small that $q_2$ (which flows from $C_2$ into this input capacitance) is negligible, and since for convenience $C_1 = C_2 = C$, it follows that:

$$X_1 = K(1 - \epsilon) \tag{10}$$

$$q_1 = CK(1 - \epsilon), q_2 = 0 \tag{11}$$

$$X_1 + V_1 = K. \tag{12}$$

Thus, the total charge on $C_1$ will now be equal to:

$$Q + q_1 = \epsilon CK + CK(1 - \epsilon) = CK. \tag{13}$$

Then, when the clocked transistor $M_2$ turns off and $M_1$ turns on, a charge q flows from $C_1$ to $C_2$; whereby the charge on $C_1$ is equal to $(Q + q_1 - q)$ and the charge on $C_2$ is $(Q + q_2 + q)$, such that again the voltages across $C_1$ and $C_2$ are the same, say $V_2$:

$$V_2 = (Q + q_1 - q)/C_1 \tag{14}$$

$$V_2 = (Q + q_2 + q)/C_2. \tag{15}$$

Since for convenience $C_1 = C_2 = C$, it follows from equations 7, 11, and 12 that:

$$q = CK(1 - \epsilon)/2 \tag{16}$$

$$V_2 = K(1 + \epsilon)/2. \tag{17}$$

Thus, the voltage here is the same as it earlier was in equation 7 (when the voltage was $\epsilon K$) except that $\epsilon$ is now replaced by $(1 + \epsilon)/2$. Thus, after once again $M_2$ turns on and $M_1$ turns off, the voltage $X_2$ at terminal X will be given by equation 10 with $\epsilon$ replaced with $(1+\epsilon)/2$; or $(1-\epsilon)$ replaced with $(1-\epsilon)/2$:

$$X_2 = K[1 - (1+\epsilon)/2] = K(1 - \epsilon)/2 \tag{18}$$

Note that $X_2$ is the same as $X_1$ except that $(1-\epsilon)$ has been replaced with $(1-\epsilon)/2$, and note that:

$$X_2 + V_2 = K. \tag{19}$$

After once again $M_2$ turns off and $M_1$ turns on, it follows that the voltages across the capacitors $C_1$ and $C_2$ will be the same, say $V_3$, and will be equal to $V_1$ except that $\epsilon$ therein is to be replaced with $(1+\epsilon)/2$:

$$V_3 = K[1 + (1+\epsilon)/2]2 = K(3+\epsilon)/4. \tag{20}$$

After once again $M_2$ turns on and $M_1$ turns off, it follows that the voltage $X_3$ at terminal X will then be given by equation 18 with $(1-\epsilon)/2$ replaced with $(1-\epsilon)/4$:

$$X_3 = K(1-\epsilon)/4. \tag{21}$$

Accordingly, from equations 20 and 21:

$$X_3 + V_3 = K. \tag{22}$$

Similarly, after $(n-1)$ full clock cycles:

$$X_n = K(1-\epsilon)/2^n \tag{23}$$

$$V_n = K(2^n - 1 + \epsilon)/2^n \tag{24}$$

$$X_n + V_n = K. \tag{25}$$

Accordingly, after many cycles $X_n$ approaches zero, while $V_n$ approaches L. Thus, the voltage at the input terminal X will soon (after a few cycles) lose its memory of any initial dc value. At the same time, the voltage at the node X will be zero during all half-cycles when the transistor $M_1$ is on. As the input voltage smoothly varies, the voltage at node X during half-cycles when $M_1$ is off ($M_2$ is on) will vary as the ac component of the input signal. Thus, the envelope of voltages at node X during half-cycles when $M_1$ is off will be a (smooth) representative of the smoothly varying voltage signal at the input terminal I, in accordance with equation 2 above. Any dc offset or change thereof contained in this signal at I will quickly be reduced to zero at the amplifier input terminal X. Thus, the output voltage $V_o$ at the output terminal O of the amplifier will not contain any input signal offset except for transients lasting for a few cycles after any change in this input signal offset.

On the other hand, since the voltage at the amplifier input terminal X jumps to zero during each half-cycle when the transistor $M_1$ is on, for carrier detection purposes the output $V_o$ of the amplifier is advantageously fed (not shown) through a full wave rectifier and a low pass (smoothing) filter to a (threshold) detector.

Operation of the Feedback Network

During those half-cycles when $M_3$ is on, the amplifier has its output terminal O connected to its negative input terminal Y; i.e., the amplifier is in its unity gain configuration. Hence, the output voltage, say $V_a$, is approximately equal to the amplifier offset voltage $v_s$ because the voltage at the input terminal X is then zero ($M_1$ also being on). Accordingly, the capacitor $C_4$ is then charged with a charge $Q_4$ given by:

$$Q_4 = C_4 v_s \quad (26)$$

where $v_s$ is the amplifier offset.

Then, when $M_3$ during the immediately succeeding half-cycle is off, the voltage at amplifier input terminal X goes from 0 to X, and in response thereto, a charge s flows from the output terminal O to the capacitor $C_3$ and from the capacitor $C_3$ to the capacitor $C_4$, whereby the voltage, say $V_b$, at the circuit output terminal O satisfies:

$$V_b = g(X + v_s - Y) \quad (27)$$

where Y is the voltage at the negative input terminal Y and g is the open loop amplifier gain. At the same time, owing to the charge flow s, the voltage across $C_3$ becomes equal to:

$$V_b - Y = s/C_3 \quad (28)$$

and the voltage across $C_4$ becomes equal to:

$$Y = s/C_4. \quad (29)$$

Solving the equations 27-29 for $V_b$, and neglecting terms of the order $g^{-1}$ or less, it is found that:

$$V_b = v_s + X(1 + C_4/C_3). \quad (30)$$

This is the same as equation 4 except for interchanging $V_b$ and $V_o$ as a matter of notation. Since ordinarily $C_4$ is selected to be more than ten times greater than $C_3$, it follows that:

$$V_b = v_s + X(C_4/C_3), \text{ approximately.} \quad (31)$$

Thus, the feedback network produces a gain of $C_4/C_3$ for the signal X without any gain in the amplifier offset $v_s$, as is desired. On the other hand, the signal X itself is substantially free of any input signal dc offset during operation as shown above in the discussion of the operation of the input network.

Note that the clocked transistors $M_1$ and $M_3$ feed charge into the same impedances and hence deliver the same charges to nodes X and Y when nodes N and M are at the same initial potentials; if this were not the case, when another undesirable offset would be introduced.

Although this invention has been described in detail with reference to a specific embodiment, various modifications can be made without departing from the scope of the invention.

What is claimed is:

1. In a semiconductor integrated circuit, a carrier detection circuit portion comprising:
   (a) a circuit portion input terminal;
   (b) an amplifier having a pair of first and second input terminals of opposite polarities and an amplifier output terminal; and
   (c) an input network comprising:
      (1) a first clocked transistor ohmically connected between a reference terminal and the first input terminal of the amplifier;
      (2) a second complementary clocked transistor connected between the circuit input terminal and an internal node;
      (3) a first capacitor connected between the internal node and the reference terminal; and
      (4) a second capacitor connected between the internal node and the first input terminal of the amplifier, whereby during operation the voltage developed at the amplifier output terminal is substantially free of any dc offset that is present in an incoming ac signal applied to the circuit portion input terminal.

2. The circuit portion of claim 1 in which the capacitance from the internal node to the reference terminal is substantially equal to the capacitance from the internal node to the first input terminal of the amplifier.

3. The circuit portion of claim 1 further comprising:
   (a) a third clocked transistor, clocked in the same way as the first transistor, connected between the amplifier output terminal and the second input terminal of the amplifier;
   (b) a third capacitor connected between the amplifier output terminal and a second internal node which is ohmically coupled to the second input terminal of the amplifier; and
   (c) a fourth capacitor connected between the second internal node and the reference terminal, whereby the operating gain of the amplifier is approximately equal to the ratio of the capacitance of the fourth to the third capacitor, and whereby the inherent input offset of the amplifier appears on the output terminal without substantial gain above unity.

4. The circuit portion of claim 3 in which the reciprocal of the capacitance of the fourth capacitor is substantially equal to the sum of the reciprocals of the capacitances of the first and second capacitors.

5. The circuit portion of claim 4 in which the capacitance of the fourth capacitor is at least a factor of ten greater than that of the third capacitor.

6. The circuit portion of claim 3 in which the capacitance of the fourth capacitor is at least a factor of ten greater than that of the third capacitor.

7. In a semiconductor integrated circuit for detecting the presence of a carrier wave on an incoming wave signal, a carrier detection circuit portion comprising:
   (a) a circuit portion input terminal;
   (b) an amplifier having a pair of first and second input terminals of opposite polarities and an amplifier output terminal; and
   (c) an input network comprising:
      (1) a first clocked transistor conductively connected between a reference terminal and the first input terminal of the amplifier;
      (2) a second complementary clocked transistor connected between the circuit input terminal and an internal node;
      (3) a first capacitor connected between the internal node and the reference terminal; and
      (4) a second capacitor connected between the internal node and the first input terminal of the amplifier, whereby during operation the voltage developed at the amplifier output terminal is substantially free of any dc offset in the incoming signal when applied to the circuit portion input terminal.

8. The circuit portion of claim 7 in which the capacitance from the internal node to the reference terminal is substantially equal to the capacitance from the internal node to the first input terminal of the amplifier.

9. The circuit portion of claim 7 further comprising:
(a) a third clocked transistor, clocked in the same way as the first transistor, connected between the amplifier output terminal and the second input terminal of the amplifier;
(b) a third capacitor connected between the amplifier output terminal and a second internal node which is ohmically coupled to the second input terminal of the amplifier; and
(c) a fourth capacitor connected between the second internal node and the reference terminal, whereby the operating gain of the amplifier is approximately equal to the ratio of the capacitance of the fourth to the third capacitor, whereby the inherent input offset of the amplifier appears on the output terminal without substantial gain above unity.

10. The circuit portion of claim 9 in which the capacitance of the first capacitor is substantially equal to that of the second capacitor.

11. The circuit portion of claim 10 in which the capacitance of the fourth capacitor is at least a factor of ten greater than that of the third capacitor.

12. The circuit portion of claim 9 in which the capacitance of the fourth capacitor is at least a factor of ten greater than that of the third capacitor.

13. In a semiconductor integrated circuit:
(a) a signal input terminal for receiving an input signal;
(b) an amplifier; and
(c) an input network comprising
(1) first and second capacitors each having a terminal connected to a common node, the second capacitor having another terminal which is connected to an input terminal of the amplifier, the first capacitor having another terminal which is connected to a reference terminal,
(2) a first clocked transistor, connected for periodically connected the input terminal of the amplifier directly to a reference terminal, and
(3) a second, complementary clocked transistor, connected for periodically connecting the signal input terminal to the common node.

* * * * *

UNITED STATES PATENT AND TRADEMARK OFFICE
CERTIFICATE OF CORRECTION

PATENT NO. : 4,580,103

DATED : April 1, 1986

INVENTOR(S) : Michael F. Tompsett

It is certified that error appears in the above-identified patent and that said Letters Patent is hereby corrected as shown below:

In column 10, line 19, "connected" should read --connecting--.

Signed and Sealed this

Second Day of December, 1986

*Attest:*

DONALD J. QUIGG

*Attesting Officer*     *Commissioner of Patents and Trademarks*